(12) United States Patent
LeClair et al.

(10) Patent No.: US 8,193,597 B2
(45) Date of Patent: Jun. 5, 2012

(54) ACOUSTIC DEVICE WITH LOW ACOUSTIC LOSS PACKAGING

(75) Inventors: Timothy LeClair, Longmont, CO (US); Bruce Beaudry, Windsor, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 126 days.

(21) Appl. No.: 12/619,963

(22) Filed: Nov. 17, 2009

(65) Prior Publication Data
US 2011/0115037 A1    May 19, 2011

(51) Int. Cl.
*H01L 29/84*    (2006.01)
(52) U.S. Cl. ......... 257/416; 257/E29.324; 257/E21.613; 438/50; 438/52
(58) Field of Classification Search .............. 257/416, 257/E29.324, E21.613; 438/50, 52
See application file for complete search history.

(56) References Cited

U.S. PATENT DOCUMENTS

| | | | |
|---|---|---|---|
| 3,790,866 A * | 2/1974 | Meyer et al. ............... | 257/702 |
| 4,942,456 A * | 7/1990 | Sako ........................... | 257/687 |
| 5,928,598 A | 7/1999 | Anderson et al. | |
| 6,487,864 B1 | 12/2002 | Platt et al. | |
| 6,696,753 B2 | 2/2004 | Tokuhara | |
| 6,704,131 B2 | 3/2004 | Liu | |
| 6,953,985 B2 | 10/2005 | Lin et al. | |
| 7,183,622 B2 | 2/2007 | Heck et al. | |
| 2004/0016995 A1 | 1/2004 | Kuo et al. | |
| 2005/0251995 A1 * | 11/2005 | Kawamura et al. ........ | 29/609.1 |
| 2006/0001123 A1 * | 1/2006 | Heck et al. .................. | 257/528 |
| 2006/0163708 A1 | 7/2006 | Yoshida | |
| 2007/0164378 A1 | 7/2007 | MacGugan | |
| 2007/0200215 A1 * | 8/2007 | Janke et al. ................ | 257/679 |
| 2008/0098621 A1 | 5/2008 | Tzeng et al. | |
| 2008/0129143 A1 * | 6/2008 | Cook et al. ................. | 310/312 |
| 2008/0203560 A1 | 8/2008 | Suzuki | |
| 2008/0219482 A1 | 9/2008 | Sato | |
| 2009/0116669 A1 | 5/2009 | Song | |
| 2010/0090295 A1 * | 4/2010 | Zhe et al. ................... | 257/415 |
| 2011/0103632 A1 | 5/2011 | Leclair et al. | |

* cited by examiner

*Primary Examiner* — Marc Armand

(57) ABSTRACT

A device includes: a substrate having an aperture therethrough from a first side of the substrate to a second side of the substrate; a semiconductor die having an acoustic transducer, the semiconductor die being provided on the first side of the substrate such that the acoustic transducer is aligned with the aperture in the substrate; and a dual in-line package having a recess formed therein. The substrate is disposed such that the first side of the substrate faces the recess of the dual in-line package, and the semiconductor die is disposed between the first side of the substrate and the bottom surface of the recess in the dual in-line package.

20 Claims, 18 Drawing Sheets

ACOUSTIC DEVICE WITH LOW ACOUSTIC LOSS PACKAGING

BACKGROUND

Small acoustic devices, including acoustic transducers, are being employed in a number of applications, including gas flow detectors, and structural flaw detectors for buildings, bridges, pressure piping. In some applications, an acoustic transducer only transmits acoustic signals. In other applications, an acoustic transducer only receives acoustic signals. In still other applications, an acoustic transducer transmits acoustic signals and receives acoustic signals. Generally, acoustic transducers convert received electrical signals to acoustic signals when operating in a transmit mode, and/or convert received acoustic signals to electrical signals when operating in a receive mode. In particular, in many devices and applications, the acoustic signal that is transmitted and/or received is an ultrasonic signal.

Acoustic transducers are manufactured using a variety of different technologies, including piezoelectric ultrasonic transducers and microelectromechanical system (MEMS) transducers. In the past, acoustic transducers have been manufactured with processes where the acoustic transducer element is placed in a metal, ceramic, or plastic package and a lid is bonded to the package.

However, acoustic losses in the packages provided for these existing acoustic devices are generally higher than would be desirable.

What is needed, therefore, is an acoustic device having a package that exhibits low acoustic loss.

SUMMARY

In an example embodiment a device comprises: a first substrate having a first aperture therethrough from a first side of the first substrate to a second side of the first substrate; a first semiconductor die having at least a first acoustic transducer, the first semiconductor die being provided on the first side of the first substrate such that the first acoustic transducer is aligned with the first aperture in the first substrate; a second substrate having a second aperture therethrough from a first side of the second substrate to a second side of the second substrate; a second semiconductor die having at least a second acoustic transducer, the second semiconductor die being provided on the first side of the second substrate such that the second acoustic transducer is aligned with the second aperture in the second substrate; and a dual in-line package having a recess therein. The first and second substrates are mounted on the dual in-line package such that the second substrate is adjacent to, and in parallel with, the first substrate. The first sides of the first and second substrates, and the recess of the dual in-line package, together define a cavity. The first and second semiconductor dies are disposed in the cavity.

In another example embodiment a device comprises: a substrate having an aperture therethrough from a first side of the substrate to a second side of the substrate; a semiconductor die having an acoustic transducer, the semiconductor die being provided on the first side of the substrate such that the acoustic transducer is aligned with the aperture in the substrate; and a dual in-line package having a recess formed therein. The substrate is disposed such that the first side of the substrate faces the recess of the dual in-line package. The semiconductor die is disposed between the first side of the substrate and a bottom surface of the recess in the dual in-line package.

In yet another embodiment, a packaged device comprises: a substrate having a first side and a second side opposite the first side; a semiconductor die having an acoustic device, the semiconductor die being disposed on the first side of the substrate; and a packaging structure. The semiconductor die having the acoustic device is disposed in a cavity defined by the substrate and the packaging structure.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions shown in the drawings may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices. As used herein, "approximately" means within 10%, and "substantially" means at least 75%. As used herein, when a first structure, material, or layer is said to cover a second structure, material, or layer, this includes cases where the first structure, material, or layer substantially or completely encases or surrounds the second structure, material or layer.

Figure 1:
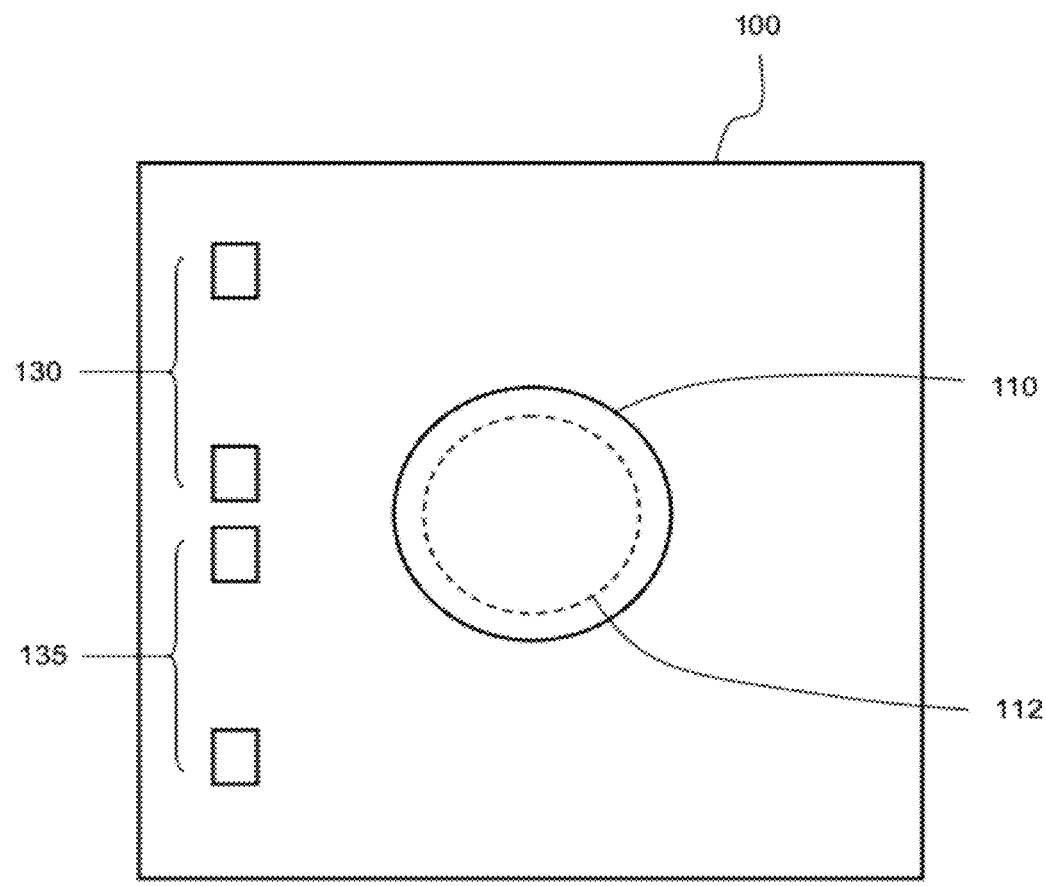
FIG. 1 shows one embodiment of a semiconductor die including an acoustic device.

FIG. 1 shows one embodiment of a semiconductor die 100 including an acoustic device 110. Semiconductor die also includes first electrode pads 130 connected to a first electrode of acoustic device 110, and second electrode pads 135 connected to a second electrode of acoustic device 110. In a beneficial embodiment, acoustic device 110 is a microelectromechanical system (MEMS) acoustic transducer having a diaphragm or membrane structure. A through-hole 112 is provided beneath the diaphragm of acoustic device 110.

For illustration purposes only, in one embodiment semiconductor die 100 has dimensions of approximately 2 mm on each side, the diaphragm of acoustic device 110 has a diameter of 540-743 μm, and through hole 112 has a diameter of 410-613 μm.

Operationally, in some embodiments, acoustic device 110 may operate as a transmitting acoustic transducer to receive an electrical signal and to produce therefrom a corresponding acoustic signal or wave which is transmitted. In other embodiments, acoustic device 110 may operate as a receiving acoustic transducer to receive an acoustic signal or wave and to produce therefrom a corresponding electrical signal which is received. In still other embodiments, acoustic device may operate as both a transmitting acoustic transducer and a receiving acoustic transducer.

Figure 2:
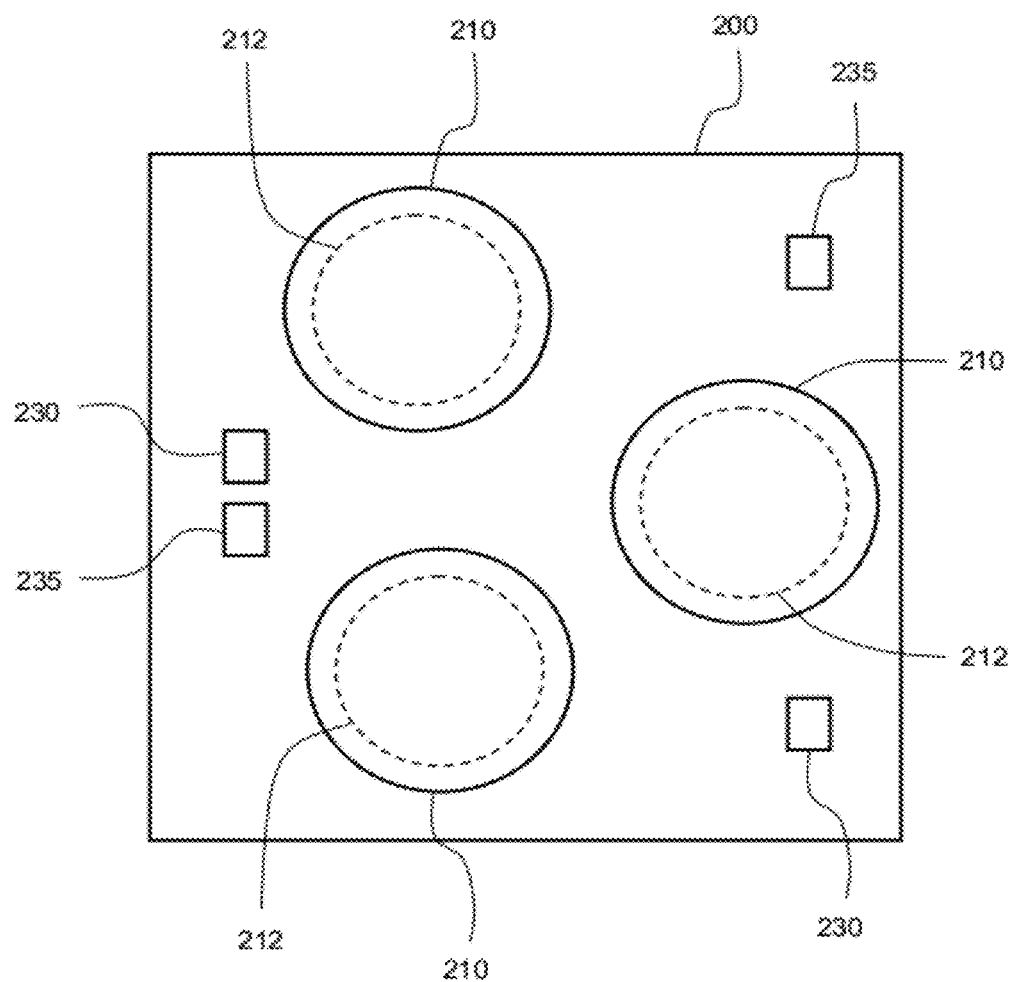
FIG. 2 shows one embodiment of a semiconductor die including a plurality of acoustic devices.

FIG. 2 shows one embodiment of a semiconductor die 200 including a plurality of acoustic devices 210. Semiconductor die also includes first electrode pads 230 connected to first electrodes of acoustic devices 210, and second electrode pads 235 connected to second electrodes of acoustic devices 210. In a beneficial embodiment, acoustic devices 210 are MEMS acoustic transducers each having a diaphragm or membrane structure. Through-holes 212 are provided beneath the diaphragms of acoustic devices 210.

For illustration purposes only, in one embodiment semiconductor die 200 has dimensions of approximately 2 mm on each side, the diaphragms of acoustic devices 210 each have a diameter of 525-779 μm, and through hole 112 has a diameter of 395-649 μm.

Figure 3:
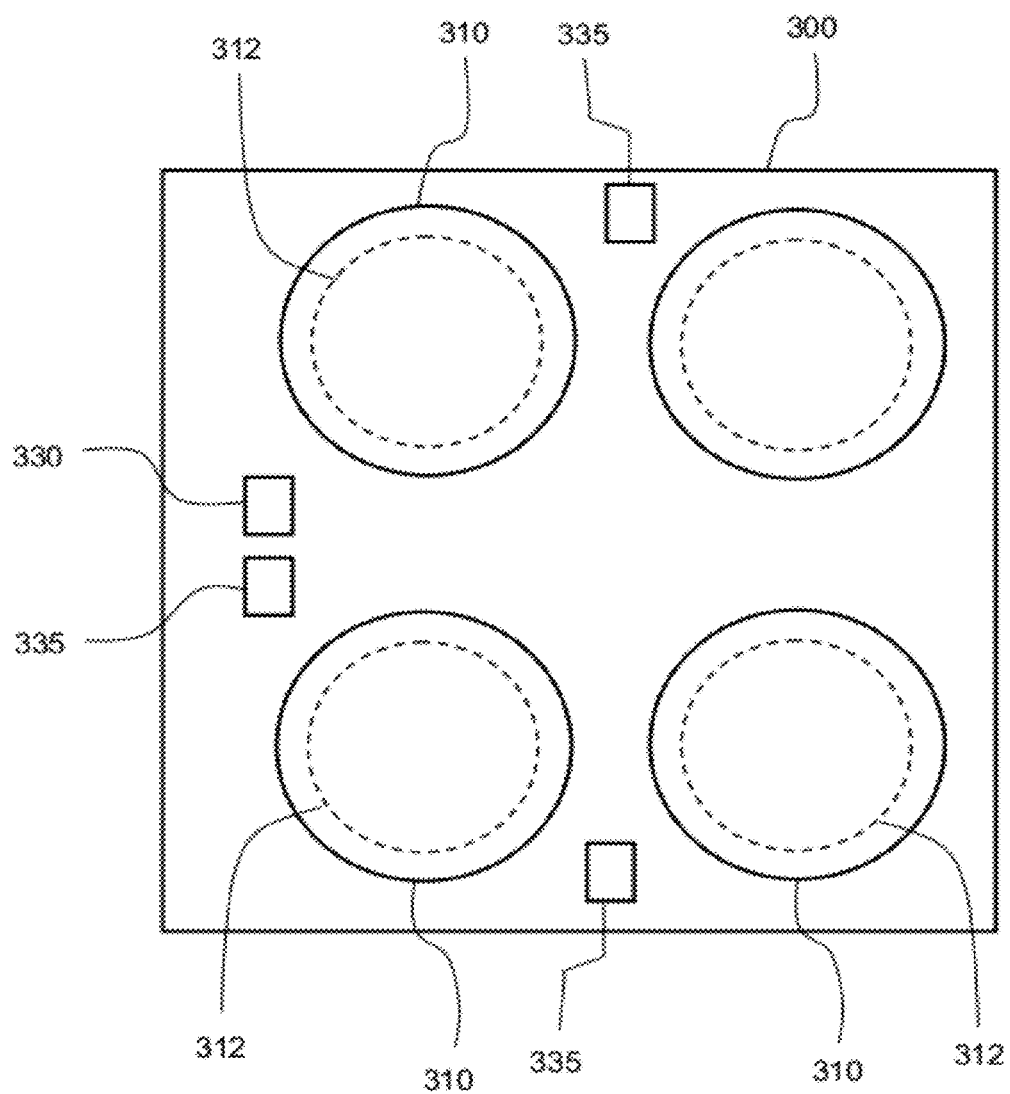
FIG. 3 shows another embodiment of a semiconductor die including a plurality of acoustic devices.

FIG. 3 shows another embodiment of a semiconductor die 300 including a plurality of acoustic devices 310. Semiconductor die also includes first electrode pads 330 connected to first electrodes of acoustic devices 310, and second electrode pads 335 connected to second electrodes of acoustic devices 310. In a beneficial embodiment, acoustic devices 310 are MEMS acoustic transducers each having a diaphragm or membrane structure. Through-holes 312 are provided beneath the diaphragms of acoustic devices 310.

For illustration purposes only, in one embodiment semiconductor die 300 has dimensions of approximately 2 mm on each side, the diaphragms of acoustic devices 310 each have a diameter of 525-779 μm, and through hole 112 has a diameter of 395-649 μm.

Figure 4A:
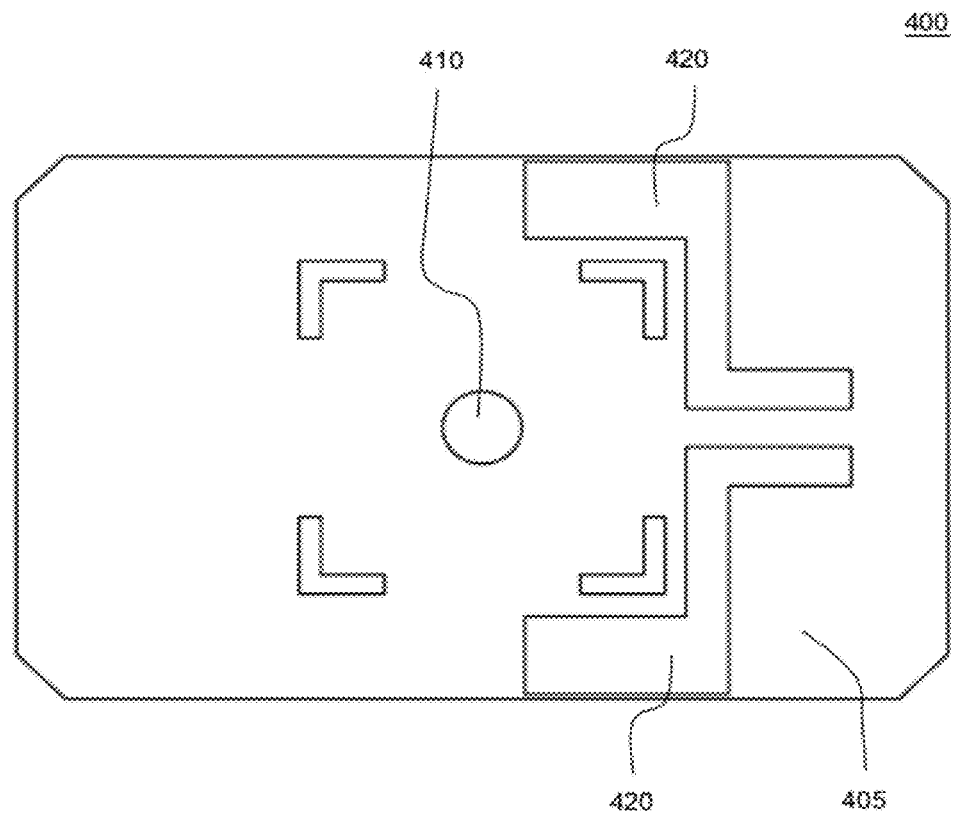
FIG. 4A shows a top view of a first embodiment of a substrate.
Figure 4B:
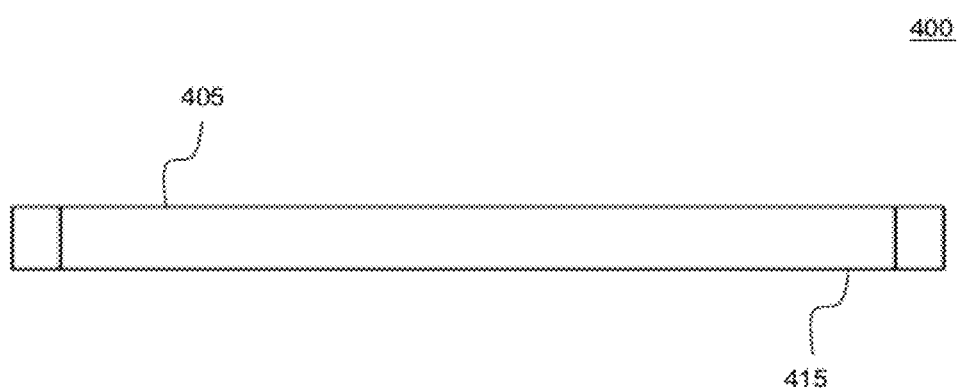
FIG. 4B shows a side view of the first embodiment of a substrate.

FIGS. 4A-B show a first embodiment of a substrate 400. In a beneficial embodiment, substrate 400 is a ceramic substrate. In a particular beneficial embodiment, substrate 400 is an alumina substrate. However other suitable materials could be employed.

As shown in FIG. 4A, pads 420 are provided on the first side 405 of substrate 400. In a beneficial arrangement, alignment marks (not labeled) are also provided on the first side 405 of substrate 400 for placing a semiconductor die on the first side 405 of substrate 400. Also, a through-hole 410 is provided in substrate 400 from the first side 405 of substrate 400 to a second side 415 of substrate 400. In some embodiments, second side 415 may be completely, or substantially, covered with a conductive layer (e.g., a metal), for example as a ground plane, and in a beneficial arrangement, through-hole 410 may be isolated from such conductive layer.

Figure 4C:
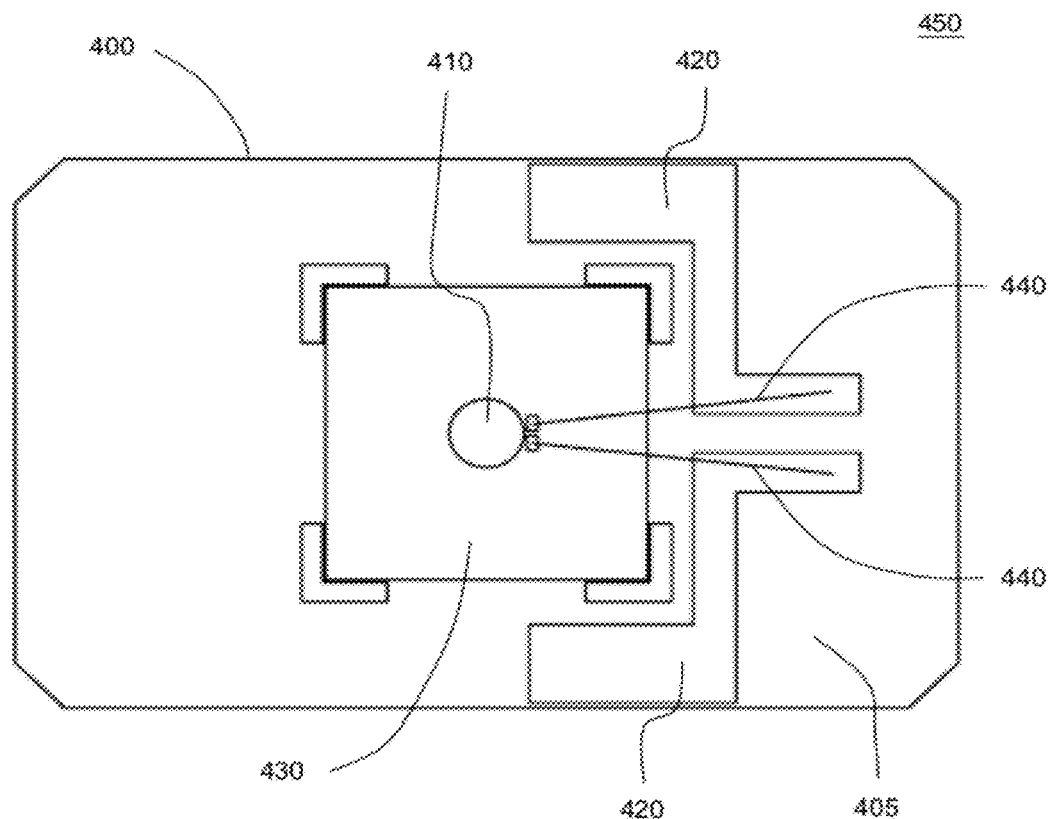
FIG. 4C shows a top view of a first embodiment of a subassembly.
Figure 4D:
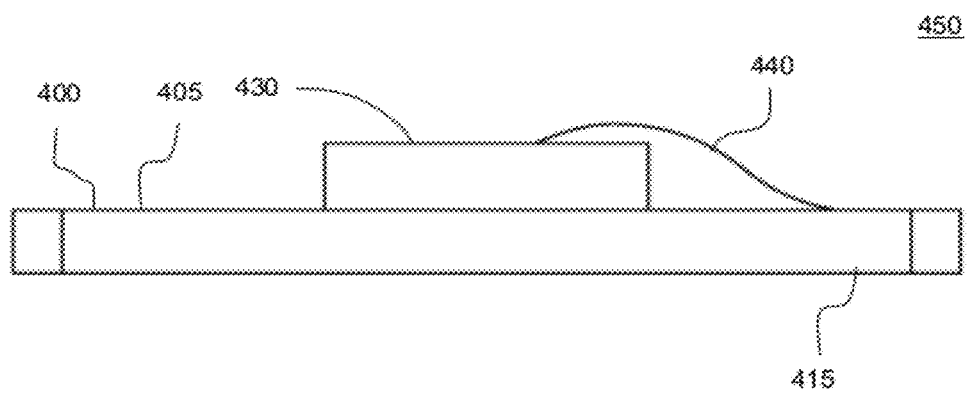
FIG. 4D shows a side view of the first embodiment of a subassembly.

FIGS. 4C-D shows a first embodiment of a subassembly 450 comprising substrate 400 assembled with a semiconductor die 430 according to one embodiment. In a beneficial arrangement, subassembly 450 is a microelectromechanical acoustic transducer subassembly. Semiconductor die 430 includes an acoustic device (see, e.g., FIGS. 1-3)—for example a MEMS acoustic transducer. In one embodiment, semiconductor die 430 may be the same as semiconductor die 100 of FIG. 1. However, in other embodiments, other semiconductor dies may be employed, such as semiconductor dies 200 and 300.

In subassembly 450, semiconductor die 430 is attached to the first side 405 of substrate 400, for example by epoxy, conductive epoxy, solder, weld, or other convenient means. Bond wires 440 connect electrode pads of semiconductor die 430 (see, e.g., FIGS. 1-3) to pads 420 on the first side 405 of substrate 400.

In a beneficial feature, in subassembly 450, through-hole 410 in substrate 400 is aligned or substantially aligned with an acoustic device (e.g., a membrane or diaphragm of an acoustic device such as acoustic device 110 in FIG. 1) of semiconductor die 430, and a through-hole in semiconductor die 430 beneath the acoustic device (see, e.g., acoustic device 110 and through-hole 112 of device 100 in FIG. 1).

Figure 5A:
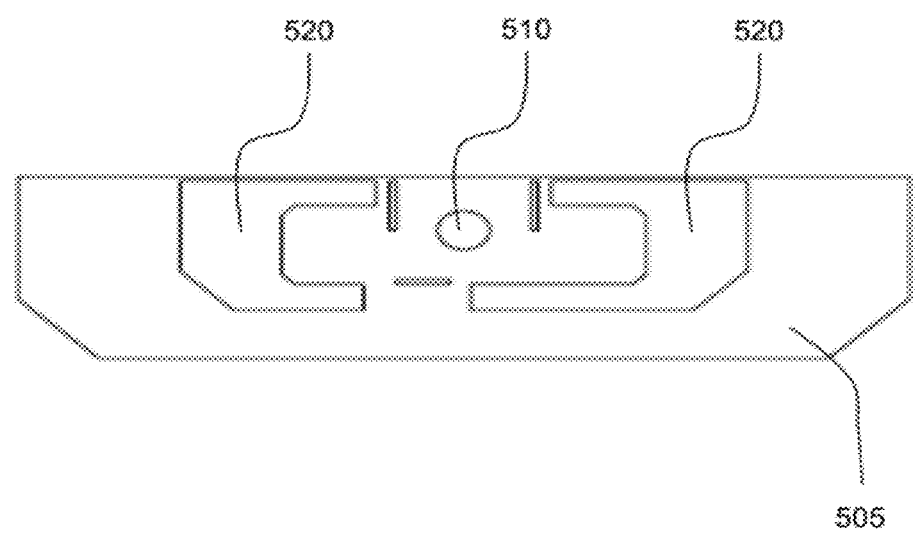
FIG. 5A shows a top view of a first side of a second embodiment of a substrate.

FIG. 5A shows a first side 505 of a second embodiment of a substrate 500. In a beneficial embodiment, substrate 500 is a ceramic substrate. In a particular beneficial embodiment, substrate 500 is an alumina substrate. However other suitable materials could be employed.

Figure 5B:
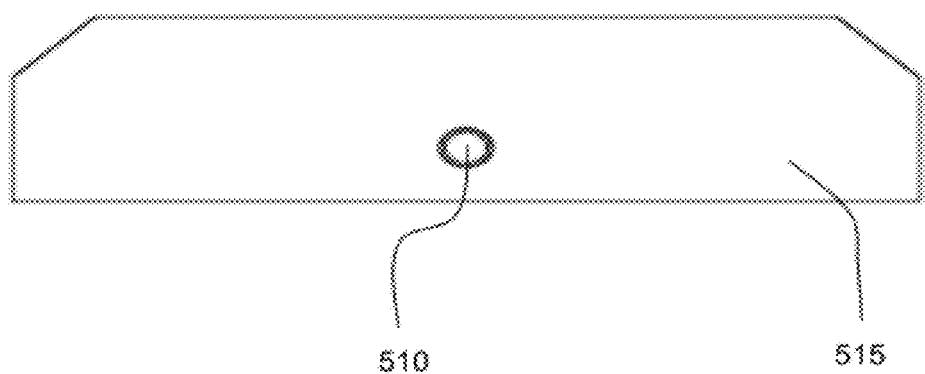
FIG. 5B shows a bottom view of a second side of the second embodiment of a substrate.

As shown in FIG. 5A, pads 520 are provided on the first side 505 of substrate 500. In a beneficial arrangement, alignment marks (not labeled) are also provided on the first side 505 of substrate 500 for placing a semiconductor die on the first side 505 of substrate 500. Also, a through-hole 510 is provided in substrate 500 from the first side 505 of substrate 500 to the second side of substrate 500. FIG. 5B shows the second side 515 of substrate 500, including the through-hole 510. In some embodiments, the second side 515 may be completely, or substantially, covered with a conductive layer (e.g., a metal), for example as a ground plane, and in a beneficial arrangement, through-hole 510 may be isolated from such conductive layer.

Figure 5C:
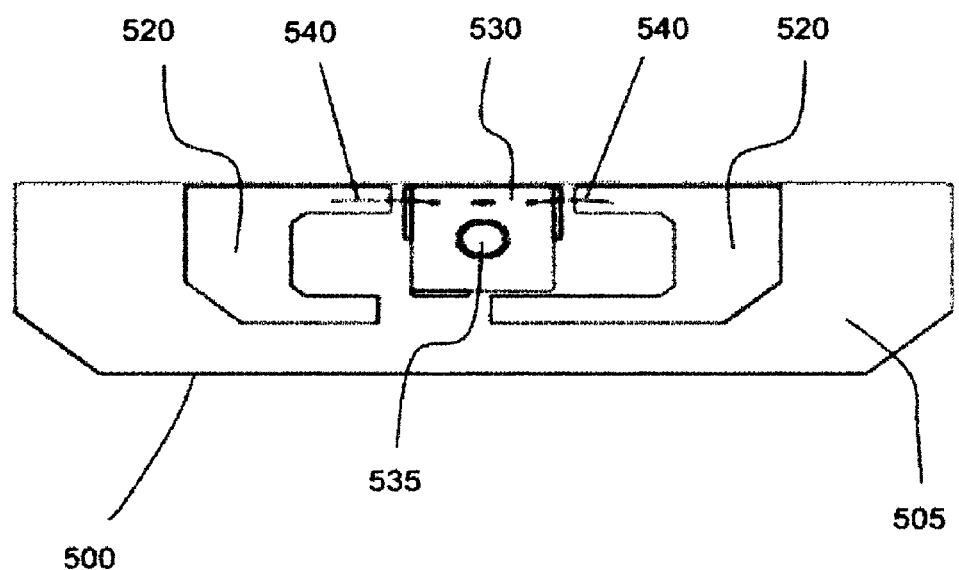
FIG. 5C shows a second embodiment of a subassembly.

FIG. 5C shows a subassembly 550 comprising substrate 500 assembled with a semiconductor die 530 according to one embodiment. In a beneficial arrangement, subassembly 550 is a microelectromechanical acoustic transducer subassembly. Semiconductor die 530 includes an acoustic device 535—for example a MEMS acoustic transducer. In one embodiment, semiconductor die 530 may be the same as semiconductor die 100 of FIG. 1. However, in other embodiments, other semiconductor dies may be employed, such as semiconductor dies 200 and 300.

In subassembly 550, semiconductor die 530 is attached to the first side 505 of substrate 500, for example by epoxy, conductive epoxy, solder, weld, or other convenient means. Bond wires 540 connect electrode pads of semiconductor die 530 (see, e.g., FIGS. 1-3) to pads 520 on the first side 505 of substrate 500.

In a beneficial feature, in subassembly 550, through-hole 510 in substrate 500 is aligned or substantially aligned with acoustic device 535 (e.g., a membrane or diaphragm of acoustic device 535) of semiconductor die 530, and a through-hole in semiconductor die 530 beneath acoustic device 535 (see, e.g., acoustic device 110 and through-hole 112 of device 100 in FIG. 1).

Figure 6A:
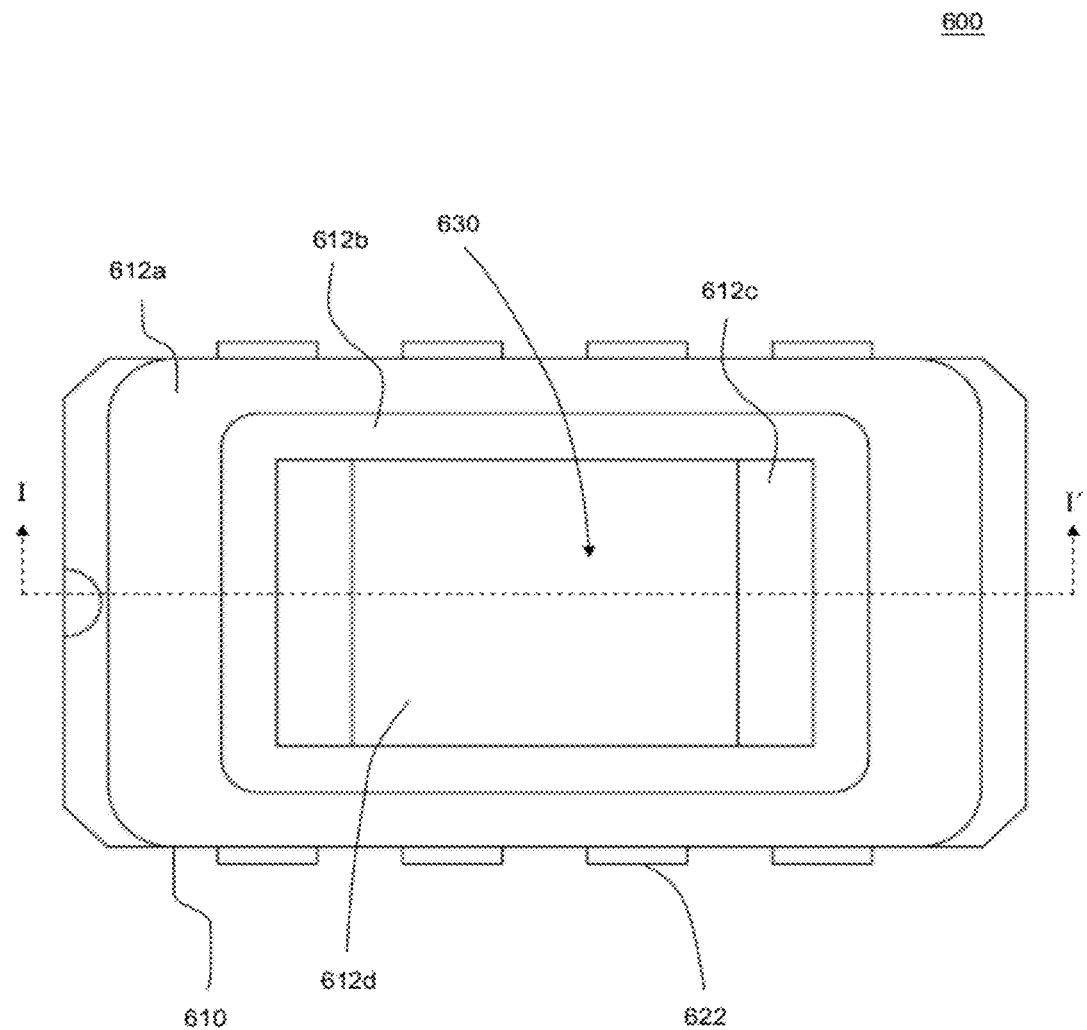
FIG. 6A shows an example embodiment of a packaging structure.
Figure 6B:
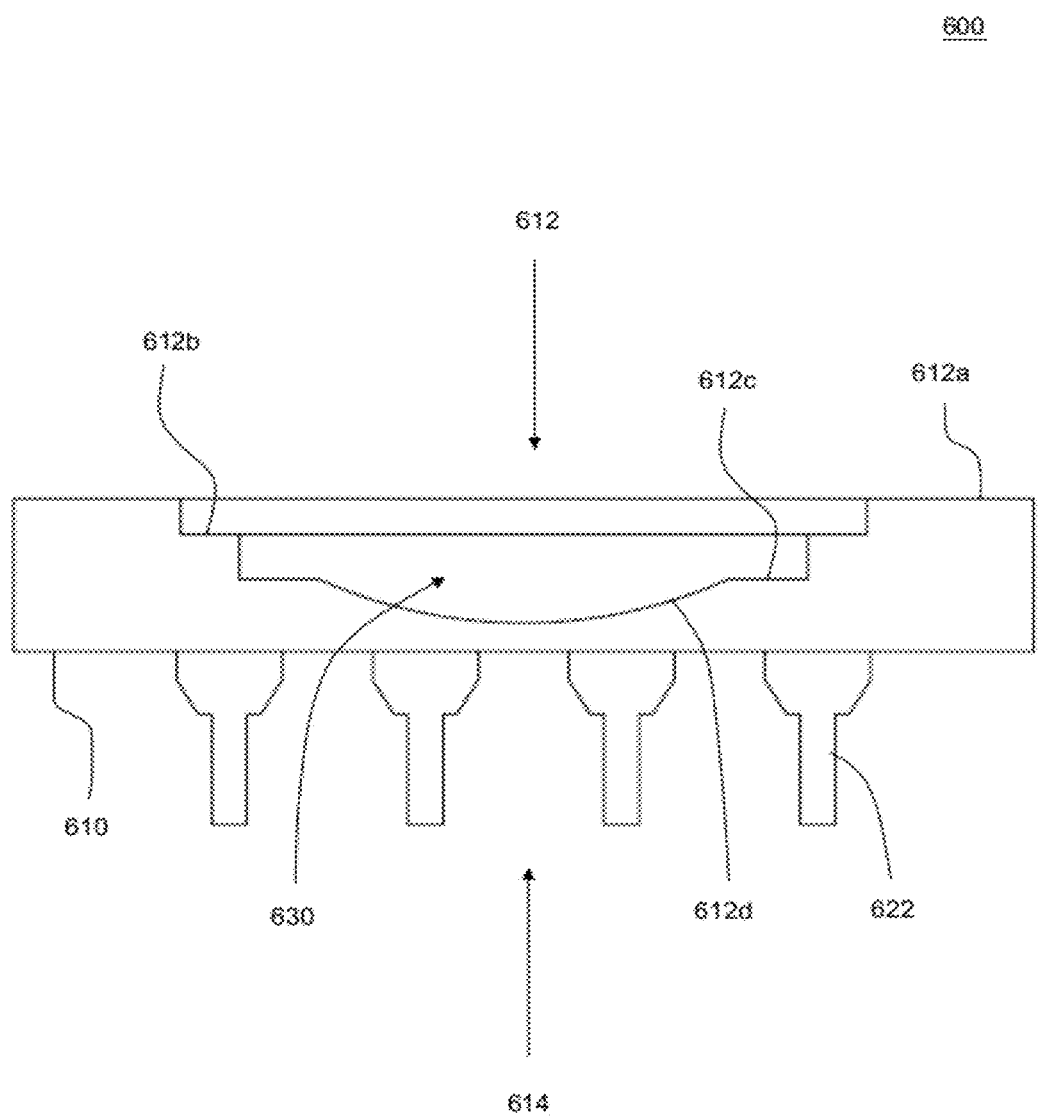
FIG. 6B shows a sectional view of the packaging structure of FIG. 6A.
Figure 6C:
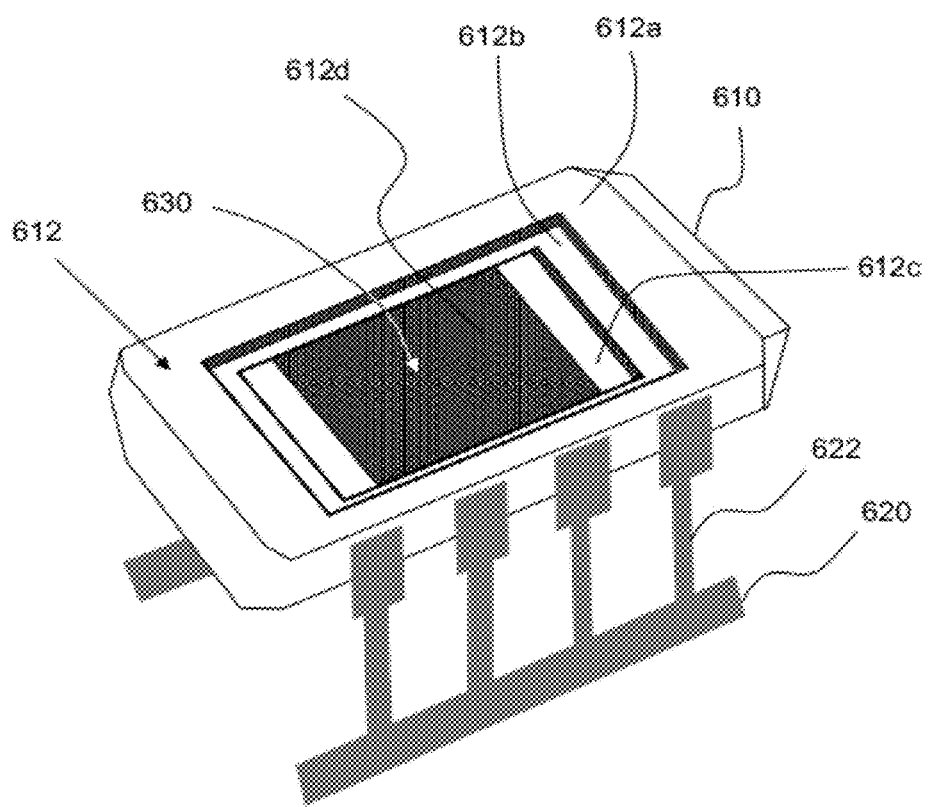
FIG. 6C shows a perspective view of the packaging structure of FIG. 6A.

FIG. 6A shows a top view of an example embodiment of a packaging structure 600. FIG. 6B shows a sectional view of packaging structure 600 along line I-I' of FIG. 6A, and FIG. 6C shows a perspective view of packaging structure 600.

In this particular example, packaging structure 600 is a side brazed dual in-line (SB DIP) package, and in more detail, an 8-pin SB DIP. Packaging structure 600 includes a body 610 having a top side 612 and a bottom side 614, and leads or pins 622. Initially, as shown in FIG. 6C, leads 622 are connected to a lead frame 620, and body 610 and leads 622 are disconnected from lead frame 620 in subsequent assembly steps. In a beneficial feature, top side 612 of body 610 of package structure 600 has a recess 630 formed therein. In this particular embodiment, top side 612 of packaging structure 600 has a top surface 612a disposed at a first level, a first intermediate surface 612b disposed a first intermediate level below the first level 612a, a second intermediate surface 612c disposed a second intermediate level below the first intermediate level 612b, and a concave bottom surface 612d that is disposed at a lower level beneath third intermediate level 613c. Recess 630 may have more or fewer intermediate surfaces and levels than in the embodiment of packaging structure 600 shown in FIG. 6.

Figure 7A:
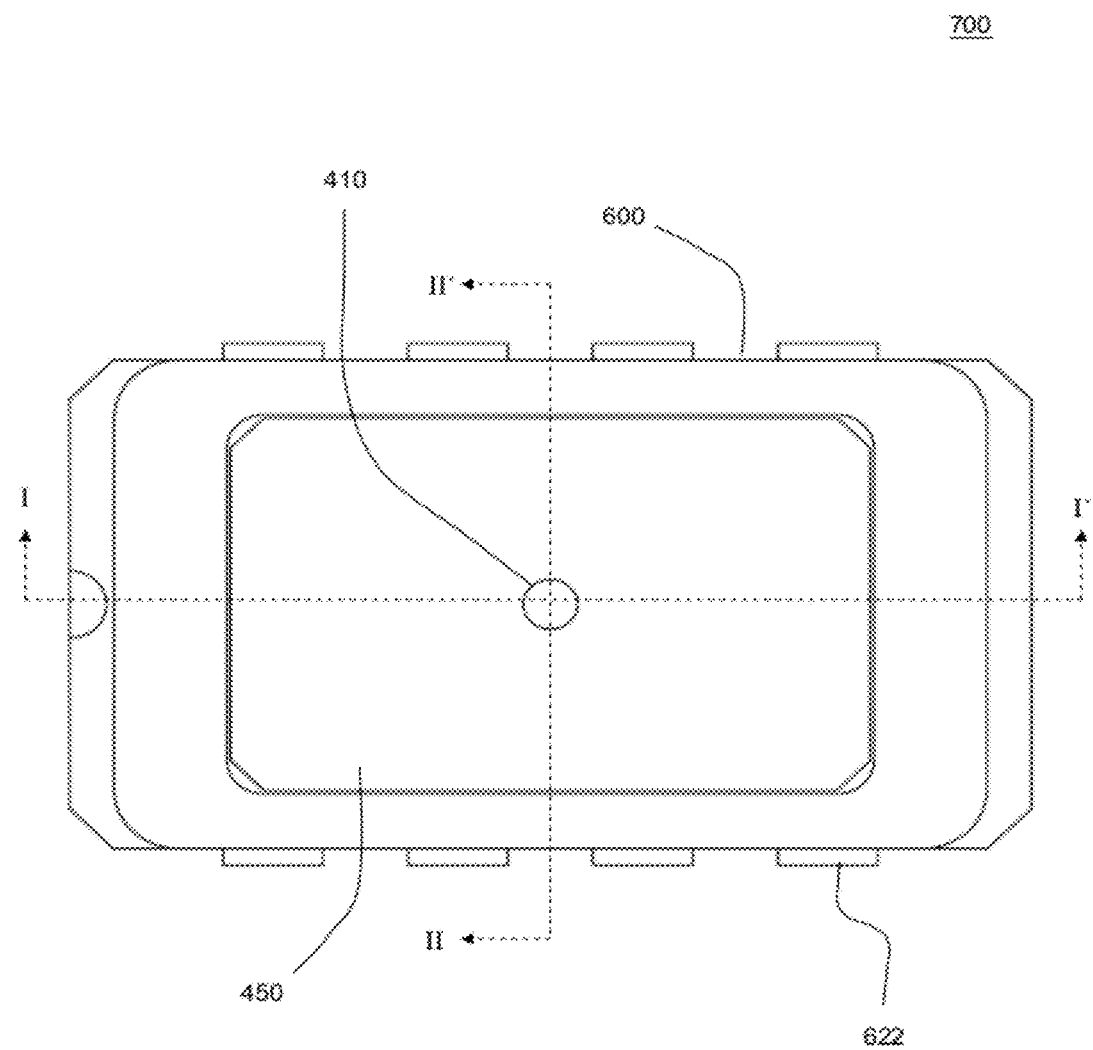
FIG. 7A shows a top view of a first embodiment of an assembly, comprising a subassembly mounted on a packaging structure.

FIG. 7A shows a top view of a first embodiment of an assembly 700.

Figure 7B:
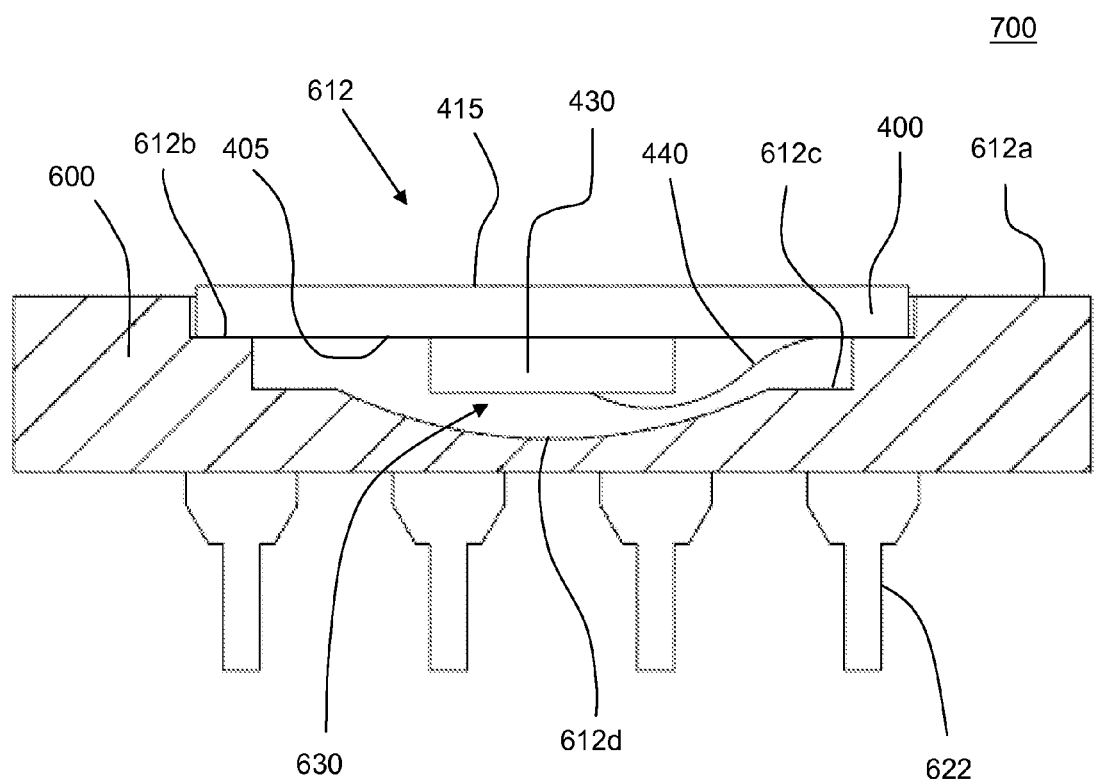
FIGS. 7B-C show two different sectional views of the assembly of FIG. 7A.
Figure 7C:
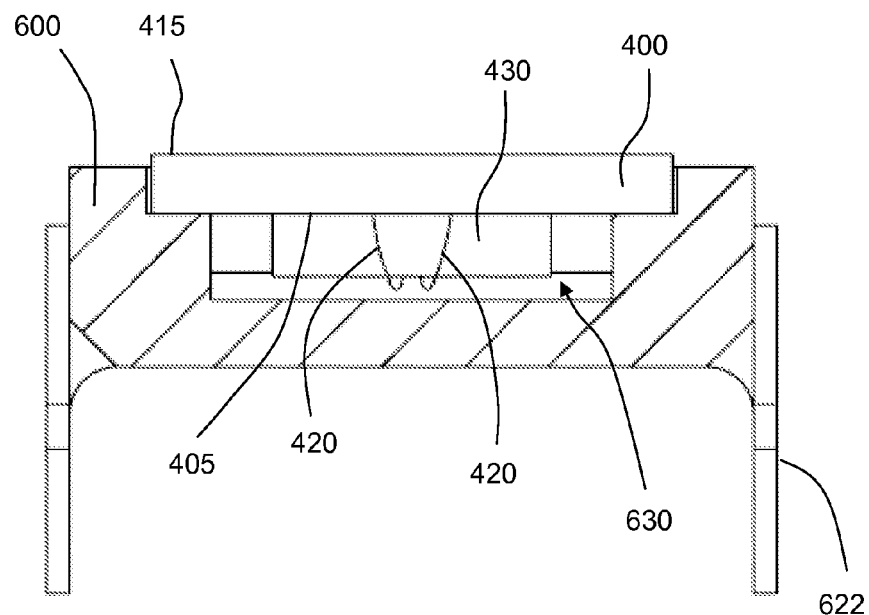

FIG. 7B shows a sectional view of assembly 700 along line I-I' of FIG. 7A, and FIG. 7C shows a sectional view of assembly 700 along line II-II' of FIG. 7A.

Assembly 700 comprises subassembly 450 mounted on packaging structure 600. In a beneficial arrangement, subassembly 450 is mounted "upside down" on packaging structure 600 such that the first side 405 of substrate 400 faces the recess 630 of packaging structure 600 to enclose recess 630, and semiconductor die 430 is disposed in the recess 630. That is, semiconductor die 430 is disposed between the first side 405 of substrate 400 and the bottom surface 612d of recess 630. As a result, the first side 405 of substrate 400 and recess 630 of packaging structure 600 together define a cavity, and semiconductor die 430 of subassembly 450 is disposed in the cavity. In the particular embodiment of FIG. 7, the first side 405 of substrate 400 is disposed on first intermediate surface 612b of packaging structure 600.

Figure 8A:
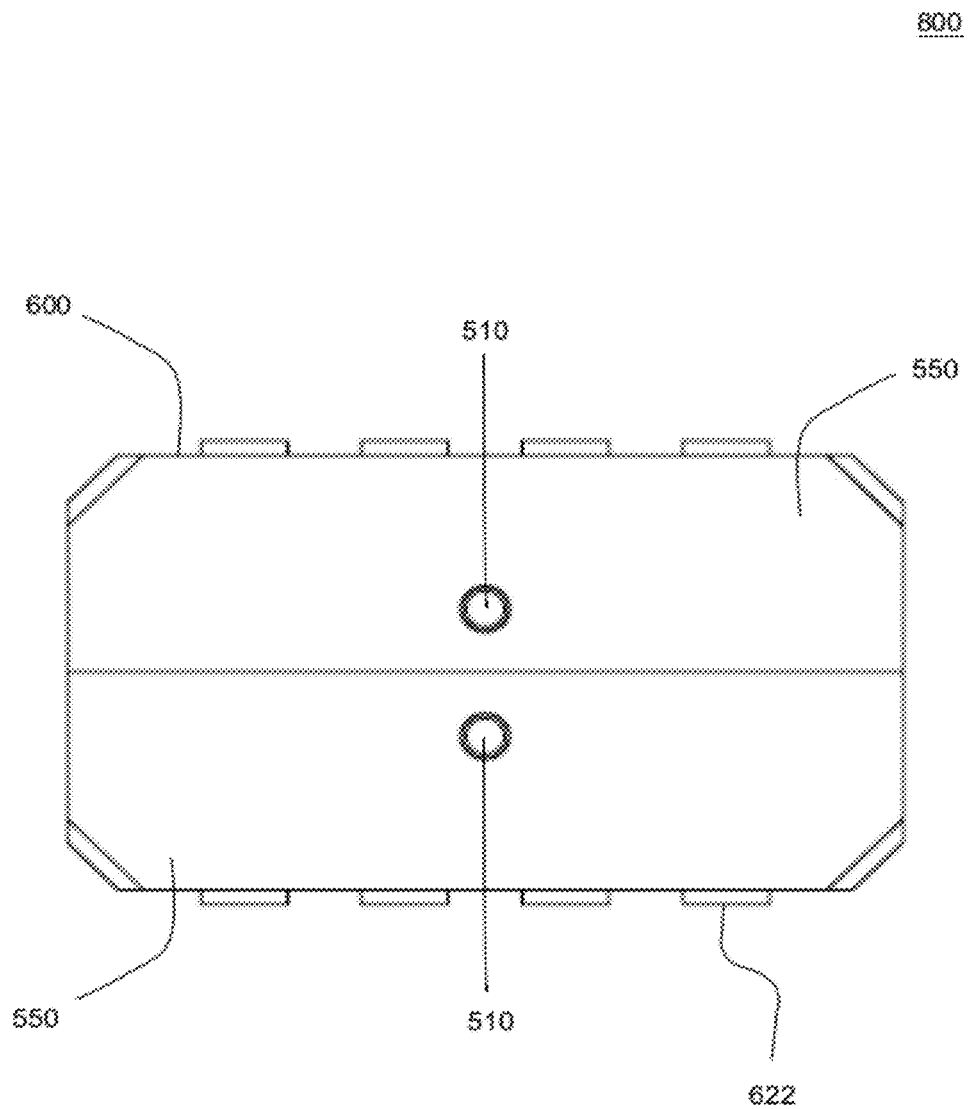
FIG. 8A shows a top view of second embodiment of an assembly, comprising two subassemblies mounted on a packaging structure.

FIG. 8A shows a top view of another embodiment of an assembly 800. Assembly 800 includes two subassemblies 550 mounted on a packaging structure 600. In a beneficial arrangement, the substrates 500 are adjacent to, and in parallel with, each other. Also in a beneficial arrangement, each subassembly 550 is mounted "upside down" on packaging structure 600 such that the first side 505 of each substrate 500 faces the recess 630 of packaging structure 600, and each of the semiconductor dies 530 of each subassembly 550 are disposed in the recess 630. That is, each semiconductor die 530 is disposed between the first side 505 of its substrate 500 and the bottom surface 612d of the recess 630. As a result, the first sides 505 of the substrates 500 and the bottom surface 612e of recess 630 of packaging structure 600 together define a cavity, and the semiconductor dies 530 of the subassemblies 550 are disposed in the cavity.

Figure 8B:
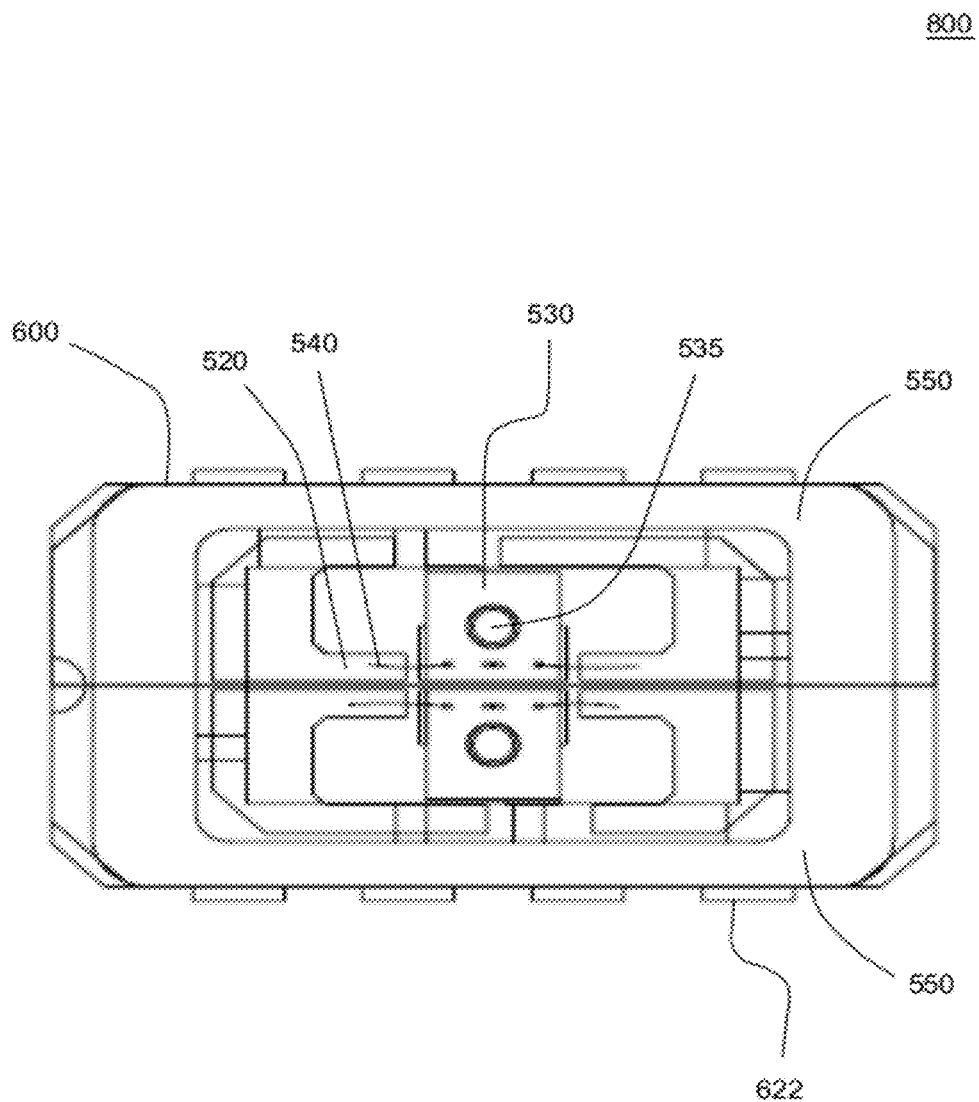
FIG. 8B shows a cutaway view of the assembly of FIG. 8A.

FIG. 8B shows a cutaway view of assembly 800.

FIGS. 9A-E show components of one embodiment of a packaged acoustic device.

Figure 9A:
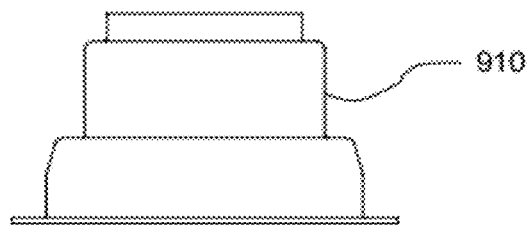
FIGS. 9A-E illustrate components of one embodiment of a packaged acoustic device.

FIG. 9A shows a can 910, in particular, a TO-3 can of a TO-3 package. Of course other packages could be employed in other embodiments.

Figure 9B:
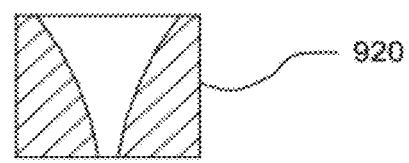

FIG. 9B shows an acoustic horn 920. Acoustic horn 920 has a first opening on the bottom thereof, and a second opening on the top thereof. In a beneficial arrangement, the diameter of the opening on the bottom is smaller than the diameter of the opening on the top.

Figure 9C:
Figure 9D:
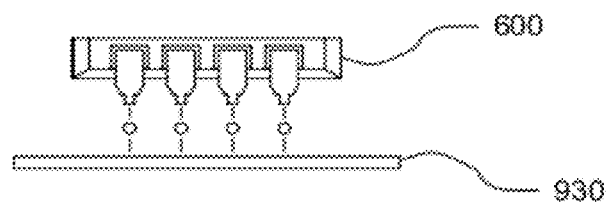

FIG. 9C shows two subassemblies 550, which will be explained with respect to FIGS. 10A-B.

Figure 10A:
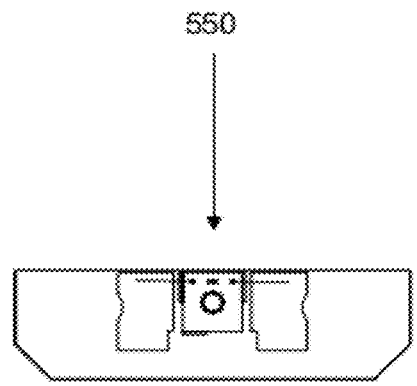
FIGS. 10A-B illustrate an assembly for one embodiment of a subassembly.
Figure 10B:
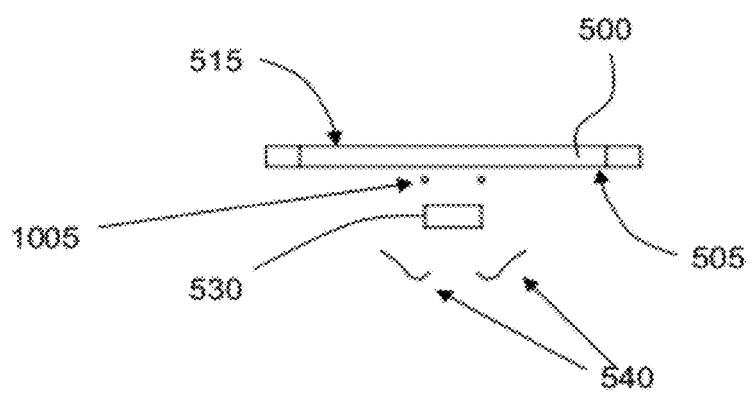

FIG. 10A-B show an assembly for one embodiment of a subassembly 550. FIG. 10A shows an embodiment of subassembly 550. FIG. 10B shows that subassembly 550 includes: substrate 500 with first side 505 and second side 515; a semiconductor die 530 to be mounted on the first side 505 of substrate 500 by adhesive dots or solder dots 1015; and bond wires 540 for connecting electrode pads of semiconductor die 530 to pads 520 on the first side 505 of substrate 500.

Turning back again to FIGS. 9A-E, FIG. 9D shows a packaging structure 600 and a substrate 930 onto which packaging structure 600 is to be mounted, for example by solder dots or conductive epoxy dots (not labeled). In a beneficial embodiment, substrate 930 is a ceramic substrate. In a particular beneficial embodiment, substrate 930 is an alumina substrate. However other suitable materials could be employed.

Figure 9E:
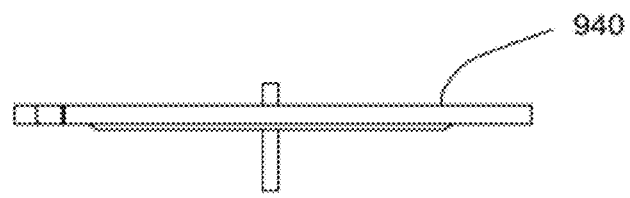

FIG. 9E shows a TO-3 flange 940 of a TO-3 package.

Figure 11A:
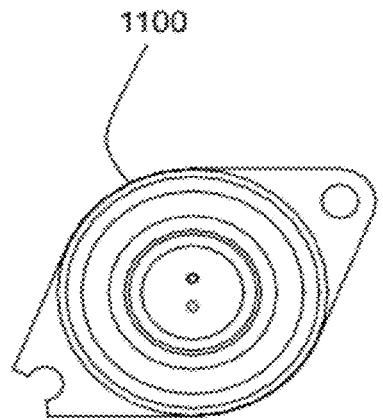
FIG. 11A shows a top view of one embodiment of a packaged acoustic device.
Figure 11B:
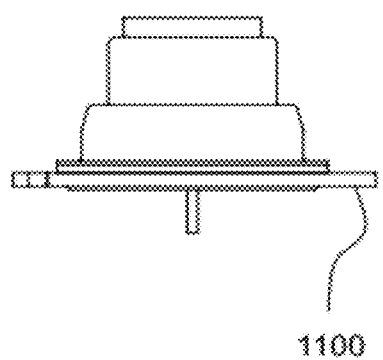
FIG. 11B shows a side view of the packaged acoustic device of FIG. 11A.

FIG. 11A-B show top and side views of one embodiment of a packaged acoustic device 1100 produced from assembly of the components illustrated in FIGS. 9A-E, an explanation of which will now be provided.

In one embodiment, the components of FIGS. 9A-E are arranged to form packaged acoustic device 1100 as follows.

Subassemblies 550 are produced by mounting semiconductor dies 530 on the first sides of substrates 500, and connecting bond wires 540 between electrode pads on semiconductor dies 530 and pads on the first sides 505 of corresponding substrates 500.

Subassemblies 550 are mounted "upside down" on package 600 to produce assembly 800, as explained above with respect to FIG. 8. Assembly 800 is mounted, for example by conductive epoxy, on substrate 930. Substrate 930 is in turn mounted on flange 940.

Acoustic horn 920 is provided on the second side 515 of substrate 500 of each subassembly 550. In a beneficial feature, the bottom ("smaller") opening in acoustic horn 920 is aligned or substantially aligned with through-hole 510 in substrate 500 and with acoustic device 535 (e.g., a membrane or diaphragm of acoustic device 535) of semiconductor die 530, and a through-hole in semiconductor die 530 beneath acoustic device 535 (see, e.g., acoustic device 110 and through-hole 112 of device 100 in FIG. 1).

Can 910 is provided on flange 940 so as to cover subassemblies 550 (including substrates 500 and semiconductor dies 530), packaging structure 600, and acoustic horn 920.

In some embodiments, packaged acoustic device 1100 operates as a transmitting acoustic device. In such embodiments, acoustic device 535 operates as a transmitting acoustic transducer, and produces an acoustic signal or wave which propagates through semiconductor die 530 (e.g., via a through-hole in the die), through substrate 500, and through acoustic horn 920 to emanate from the packaged acoustic device 1000. In that case, in a beneficial feature the inverted mounting configuration of subassemblies 550, and in particular semiconductor dies 530, reduces acoustic loss of the acoustic signal generated by acoustic transducer 535. In other embodiments, packaged acoustic device 1100 may operate as a receiving acoustic device, or as a transmitting/receiving acoustic device, with acoustic device 535 corresponding operating as a receiving acoustic transducer or a transmitting/receiving acoustic transducer.

FIGS. 9-10 illustrate an embodiment of a packaged acoustic device 1100 which includes assembly 800 having two subassemblies 550 mounted on packaging structure 600. However, a similar description can be applied to produce another embodiment of packaged acoustic device 1100 that includes assembly 700 having a single subassembly 450 mounted on packaging structure 600.

In a beneficial feature of embodiments described above, the inverted mounting configuration of one or more subassemblies, and in particular one or more semiconductor dies on the packaging structure, reduces acoustic loss of the acoustic signal generated by the acoustic transducer(s). In a beneficial arrangement, low acoustic loss is achieved by mounting the bottom hole of the die against the hole in the substrate. In contrast, for example, if the semiconductor die is mounted directly onto the bottom surface of the recess of the SB DIP package described above with respect to FIG. 6, and one tried to collect the acoustic signal from the top membrane of the chip, the signal losses would be unacceptable.

While example embodiments are disclosed herein, one of ordinary skill in the art appreciates that many variations that are in accordance with the present teachings are possible that remain within the scope of the appended claims. The embodiments therefore are not to be restricted except within the scope of the appended claims.

The invention claimed is:

1. A device, comprising:
a first substrate having a first aperture therethrough from a first side of the first substrate to a second side of the first substrate;
a first semiconductor die having at least a first acoustic transducer, the first semiconductor die being provided on the first side of the first substrate such that the first acoustic transducer is aligned with the first aperture in the first substrate;
a second substrate having a second aperture therethrough from a first side of the second substrate to a second side of the second substrate;
a second semiconductor die having at least a second acoustic transducer, the second semiconductor die being provided on the first side of the second substrate such that the second acoustic transducer is aligned with the second aperture in the second substrate; and
a dual in-line package having a recess therein;
wherein the first and second substrates are mounted on the dual in-line package such that the second substrate is adjacent to, and in parallel with, the first substrate,
wherein the first sides of the first and second substrates, and the recess of the dual in-line package, together define a cavity, and
wherein the first and second semiconductor dies are disposed in the cavity.

2. The device of claim 1, further comprising at least one acoustic horn provided adjacent the second side of the first substrate, the acoustic horn having a first opening having a first diameter and a second opening opposite the first opening, the second opening having a second diameter greater than the first diameter, wherein the first opening is adjacent to and aligned with the first aperture in the first substrate.

3. The device of claim 1, wherein the first semiconductor die includes at least a pair of electrode pads connected to electrodes of the first acoustic transducer, and wherein a plurality of substrate pads are provided on the first side of the first substrate, the device further comprising a plurality of wire bonds electrically connecting the electrode pads of the first semiconductor die to the substrate pads of the first substrate.

4. The device of claim 1, wherein the first and second substrates are alumina substrate.

5. The device of claim 1, wherein at least one of the first and second semiconductor dies includes a second acoustic transducer, 6. The device of claim 1, wherein the dual in-line package includes a plurality of pins, the device further comprising a third substrate disposed at an opposite side of the dual in-line package as the recess in the dual in-line package, wherein the pins are directly connected to the third substrate.

7. The device of claim 1, wherein the first and second acoustic transducers each comprise a microelectromechanical systems (MEMS) membrane.

8. The device of claim 6, further comprising a TO-3 package, the TO-3 package including:
a TO-3 flange onto which the third substrate is mounted; and
a TO-3 can mounted on the flange and covering the first and second substrates, the first and second semiconductor dies, and the dual in-line package,
wherein the first and second substrates, the first and second semiconductor dies, and the dual in-line package are disposed in a space between the TO-3 flange and the TO-3 can.

9. A device, comprising:
a substrate having an aperture therethrough from a first side of the substrate to a second side of the substrate;
a semiconductor die having an acoustic transducer, the semiconductor die being provided on the first side of the substrate such that the acoustic transducer is aligned with the aperture in the substrate; and
a dual in-line package having a recess formed therein,
wherein the substrate is disposed such that the first side of the substrate faces the recess of the dual in-line package, and
wherein the semiconductor die is disposed between the first side of the substrate and a bottom surface of the recess in the dual in-line package.

10. The device of claim 9, further comprising an acoustic horn provided adjacent the second side of the substrate, the acoustic horn having a first opening adjacent to and aligned with the aperture in the substrate and having a second opening opposite the first opening.

11. The device of claim 9, wherein a plurality of substrate pads are provided on the first side of the substrate, the device further comprising a plurality of wire bonds electrically connecting the semiconductor die to the substrate pads.

12. The device of claim 9, wherein the substrate is a ceramic substrate.

13. The device of claim 9, wherein the semiconductor die includes a second acoustic transducer.

14. The device of claim 9, wherein the dual in-line package includes a plurality of pins, the device further comprising a second substrate, wherein the pins are connected to the second substrate.

15. The device of claim 14, further comprising a TO-3 package, the TO-3 package including:
   a TO-3 flange onto which the second substrate is mounted; and
   a TO-3 can mounted on the flange and covering the substrate, the semiconductor die, and the dual in-line package,
   wherein the substrate, the semiconductor die, the dual in-line package are disposed in a space between the TO-3 flange and the TO-3 can.

16. A packaged device, comprising:
   a packaging structure having a first side and a second side opposite the first side,
   wherein the first side has a top surface with a recess formed therein, the recess having a bottom surface and an intermediate surface located at a level between the top surface and the bottom surface;
   a substrate having a first side and a second side opposite the first side, wherein the first side of the substrate is disposed on the intermediate surface of the packaging structure such that the first side of the substrate is located closer than the second side of the substrate to the intermediate surface of the packaging structure, and wherein the packaging structure and the first side of the substrate define a cavity therebetween that is located at the first side of the substrate;
   a semiconductor die having an acoustic device, the semiconductor die being disposed on the first side of the substrate within the cavity.

17. The packaged device of claim 16, wherein the semiconductor die includes a second acoustic device.

18. The packaged device of claim 16, wherein the packaging structure is a dual in-line package having a plurality of pins, the packaged device further comprising a second substrate, wherein the pins are connected to the second substrate.

19. The packaged device of claim 18, further comprising a TO-3 package, the TO-3 package including:
   a TO-3 flange onto which the second substrate is mounted; and
   a TO-3 can mounted on the flange and covering the substrate, the semiconductor die, and the dual in-line package,
   wherein the substrate, the semiconductor die, the dual in-line package are disposed in a space between the TO-3 flange and the TO-3 can.

20. A packaged device, comprising:
   a packing structure having a first side and a second side opposite the first side, wherein the first side has a top surface with a recess formed therein, the recess having a bottom surface and an intermediate surface located at a level between the top surface and the bottom surface;
   a substrate having a first side and a second side opposite the first side, wherein first side of the substrate is disposed on the intermediate surface of the packaging structure such that the first side of the substrate is located closer than the second side of the substrate to the intermediate surface of the packaging structure, and wherein the packaging structure and the first side of the substrate define a cavity therebetween that is located at the first side of the substrate; and
   a semiconductor die having an acoustic device, the semiconductor die being disposed on the first side of the substrate within the cavity,
   wherein the substrate includes an aperture therethrough from a first side of the substrate to a second side of the substrate such that the acoustic device is aligned with the aperture in the substrate, the packaged device further comprising an acoustic horn provided adjacent the second side of the substrate, the acoustic horn having a first opening adjacent to and aligned with the aperture in the substrate.

* * * * *